United States Patent
Yamazaki et al.

(10) Patent No.: US 12,466,184 B2
(45) Date of Patent: Nov. 11, 2025

(54) LIQUID EJECTING HEAD, LIQUID EJECTING APPARATUS, AND PIEZOELECTRIC DEVICE

(71) Applicant: SEIKO EPSON CORPORATION, Tokyo (JP)

(72) Inventors: Yasushi Yamazaki, Azumino (JP); Masaki Mori, Shiojiri (JP); Eiju Hirai, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 205 days.

(21) Appl. No.: 18/322,423

(22) Filed: May 23, 2023

(65) Prior Publication Data

US 2023/0382114 A1     Nov. 30, 2023

(30) Foreign Application Priority Data

May 26, 2022   (JP) .................................. 2022-085846

(51) Int. Cl.
  *B41J 2/14*       (2006.01)
  *H10N 30/20*    (2023.01)
(52) U.S. Cl.
  CPC ...... *B41J 2/14233* (2013.01); *H10N 30/2047* (2023.02)

(58) Field of Classification Search
  CPC .......... B41J 2/14233; B41J 2002/14241; B41J 2002/14419; B41J 2002/14491; B41J 2202/11; B41J 2/14201; H10N 30/2047; H10N 30/87
  See application file for complete search history.

(56) References Cited

FOREIGN PATENT DOCUMENTS

| JP | 2010-208136 A | | 9/2010 |
| JP | 2015085668 A | * | 5/2015 |
| JP | 2015-166160 A | | 9/2015 |

OTHER PUBLICATIONS

Furuya Noboru, "Liquid Ejection Head and Liquid Ejection Device" (JP 2015085668 A), May 7, 2015, [Abstract, Description of Embodiments: Paragraphs 0002-0003, 0006-0029] (Year: 2015).*

* cited by examiner

*Primary Examiner* — Lisa Solomon
(74) *Attorney, Agent, or Firm* — WORKMAN NYDEGGER

(57) ABSTRACT

The vibration plate, the first electrode, the piezoelectric layer, and the second electrode are stacked in this order from the pressure chamber plate side in an active area facing the pressure chamber. An area located outwardly from the active area in a longitudinal direction of the pressure chamber includes a first area in which the piezoelectric layer, the second electrode, the insulating layer, and the first conductive layer are stacked in this order, and a second area in which the piezoelectric layer and the insulating layer are stacked in this order without the second electrode and the first conductive layer.

16 Claims, 11 Drawing Sheets

LIQUID EJECTING HEAD, LIQUID EJECTING APPARATUS, AND PIEZOELECTRIC DEVICE

The present application is based on, and claims priority from JP Application Serial Number 2022-085846, filed May 26, 2022, the disclosure of which is hereby incorporated by reference herein in its entirety.

BACKGROUND

1. Technical Field

The present disclosure relates to a liquid ejecting head and a liquid ejecting apparatus each including a piezoelectric element that includes a first electrode, a piezoelectric layer, and a second electrode, a vibration plate that is vibrated when the piezoelectric element is driven, and a pressure chamber plate that defines a pressure chamber that applies pressure to a liquid when the vibration plate is vibrated, and relates to a piezoelectric device including the piezoelectric element and the vibration plate.

2. Related Art

A typical example of a liquid ejecting head, which is a piezoelectric device, includes an ink jet recording head that ejects ink droplets. A known ink jet recording head includes, for example, a pressure chamber plate, which have pressure chambers in communication with nozzles, and piezoelectric elements, which are on a surface of the pressure chamber plate with a vibration plate therebetween. The piezoelectric elements move the vibration plate to change the pressure of ink in the pressure chambers, and thus ink droplets are ejected through the nozzles.

A known piezoelectric element includes a first electrode located on the vibration plate, a piezoelectric layer formed of a piezoelectric material having electromechanical transduction properties and located on the first electrode, and a second electrode located on the piezoelectric layer (e.g., JP-A-2015-166160).

JP-A-2015-166160 discloses a configuration that includes multiple piezoelectric elements arranged in one line. Each piezoelectric element has an active portion (also called an operative portion) in which the piezoelectric layer is sandwiched between a first electrode, which is an individual electrode, and a second electrode, which is a common electrode. In the direction perpendicular to the direction in which the piezoelectric elements are arranged, the end of the active portion is defined by the end of the second electrode.

The configuration in which the end of the active portion of the piezoelectric element is defined by the end of the second electrode may have damage, such as fire damage due to short circuit caused by migration or the like, around the end of the active portion. Furthermore, if moisture enters a portion where the piezoelectric layer is exposed, the piezoelectric layer may be damaged in a relatively short time due to hydrolysis.

To solve such problems, a known configuration includes an adhesive layer formed of an adhesive to protect a portion near the end of active portion of the piezoelectric element. Specifically, a known configuration includes an exposed portion through which the piezoelectric layer is exposed between a first wiring layer, which is a wiring line coupled to the individual electrode of the piezoelectric element, and a first metal layer, which is a wiring line coupled to the common electrode of the piezoelectric element, and the exposed portion is covered by the adhesive layer formed of an adhesive (see JP-A-2015-85668).

In this configuration, the adhesive layer insulates the wiring lines that have the exposed portion of the piezoelectric layer therebetween, and thus damage to the piezoelectric layer caused by migration or the like can be reduced.

However, in the configuration described in JP-A-2015-85668 in which an adhesive fills the space between the wiring lines, i.e., the exposed portion, the adhesive may insufficiently fill the space between the wiring lines, and the space may have remaining air bubbles or the like. In such a case, the wiring lines may be insufficiently insulated, and damage to the piezoelectric layer caused by migration or the like cannot be reduced in some cases.

Such a problem occurs not only in an ink jet recording head that ejects ink, which is an example of liquid ejecting heads, but also in other piezoelectric devices.

SUMMARY

According to an aspect of the present disclosure, a liquid ejecting head includes a piezoelectric element including a first electrode, a piezoelectric layer, and a second electrode; a first conductive layer electrically coupled to the second electrode; an insulating layer formed of an insulating material; a vibration plate that is vibrated when the piezoelectric element is driven; and a pressure chamber plate defining a pressure chamber that applies pressure to a liquid when the vibration plate is driven. The vibration plate, the first electrode, the piezoelectric layer, and the second electrode are stacked in this order from a side of the pressure chamber plate in an active area facing the pressure chamber, and an area located outwardly from the active area in a first direction includes: a first area in which the piezoelectric layer, the second electrode, the insulating layer, and the first conductive layer are stacked in this order in a second direction that intersects the first direction; and a second area in which the piezoelectric layer and the insulating layer are stacked in this order in the second direction without the second electrode and the first conductive layer.

According to another aspect of the present disclosure, a liquid ejecting apparatus includes the above-described liquid ejecting head.

According to another aspect of the present disclosure, a piezoelectric device includes: a substrate having a recess; a piezoelectric element including a first electrode, a piezoelectric layer, and a second electrode; a vibration plate that is vibrated when the piezoelectric element is driven; a first conductive layer electrically coupled to the second electrode; and an insulating layer formed of an insulating material, wherein the vibration plate, the first electrode, the piezoelectric layer, and the second electrode are stacked in this order from a side of the substrate in an active area having the recess, and an area located outwardly from the active area in a first direction includes: a first area in which the piezoelectric layer, the second electrode, the insulating layer, and the first conductive layer are stacked in this order in a second direction that intersects the first direction; and a second area in which the piezoelectric layer and the insulating layer are stacked in this order in the second direction without the second electrode and the first conductive layer.

DESCRIPTION OF EXEMPLARY EMBODIMENTS

Figure 1:
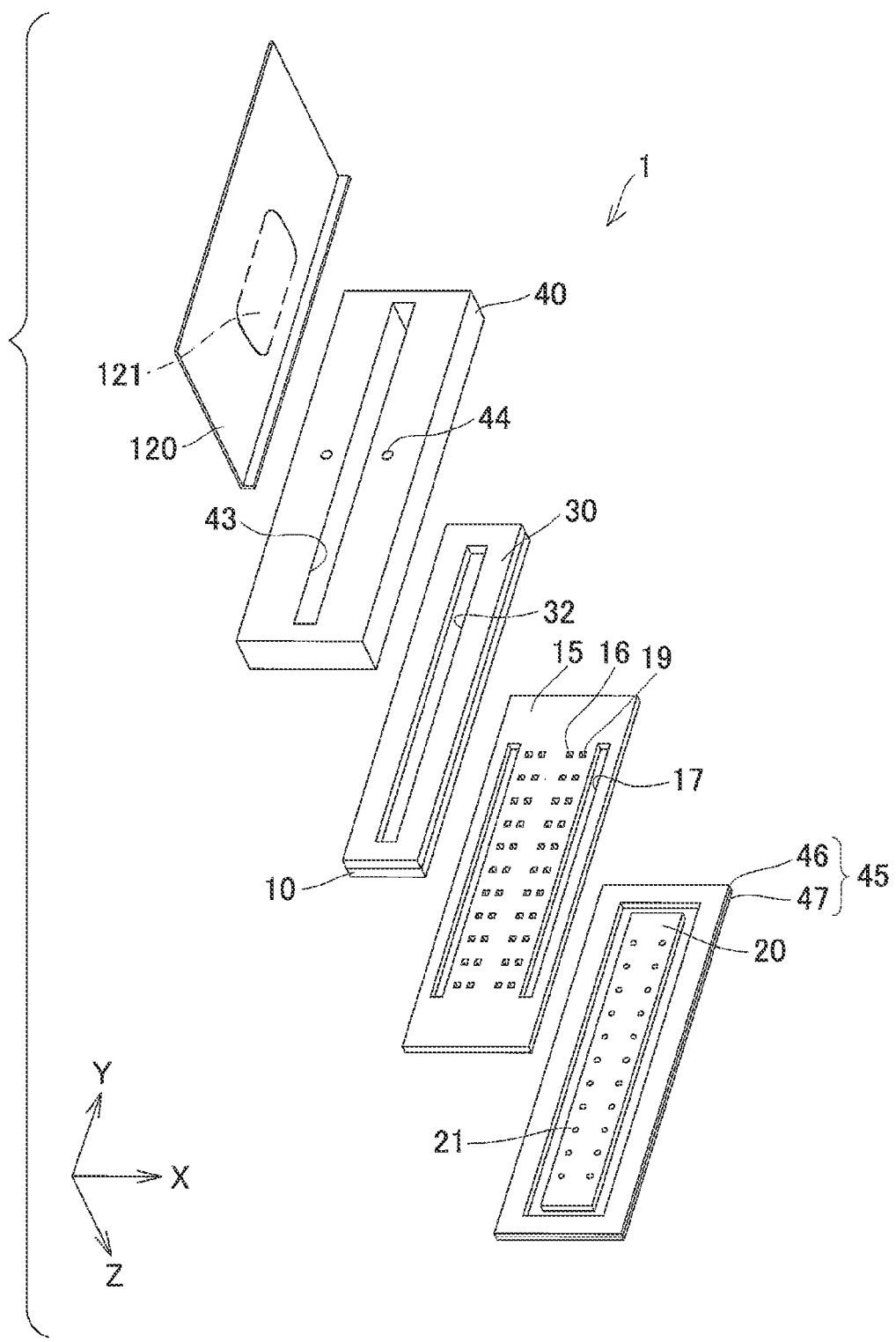
FIG. 1 is an exploded perspective view illustrating a recording head according to First Embodiment.

Hereinafter, the present disclosure will be described in detail with reference to embodiments. However, the following is only a description of an aspect of the present disclosure. Any modification can be made to the configuration of the present disclosure within the scope of the present disclosure.

In the drawings, X, Y, and Z represent three orthogonal spatial axes. Herein, the directions along the axes are referred to as X, Y, and Z directions. The directions pointed by the arrows in the drawings are referred to as positive (+) directions and the opposite directions are referred to as negative (−) directions. The Z direction corresponds to the vertical direction. The +Z direction corresponds to a vertically downward direction, and the −Z direction corresponds to a vertically upward direction. The three spatial axes of X, Y, and Z without limitation of the positive and negative directions are referred to as X, Y, and Z axes. The +X direction is an example of a first direction and the −Z direction is an example of a second direction.

First Embodiment

Figure 2:
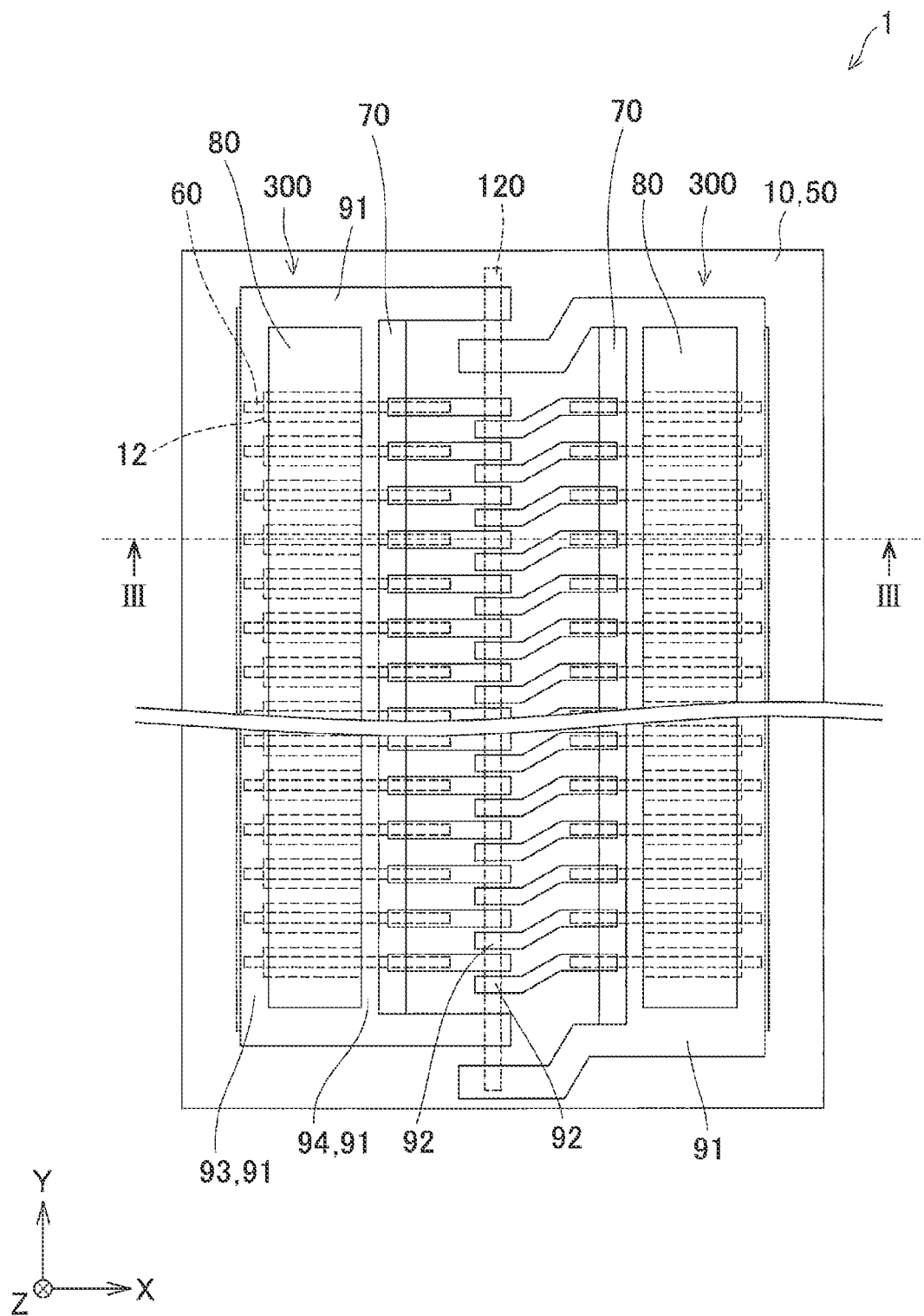
FIG. 2 is a plan view illustrating the recording head according to First Embodiment.
Figure 3:
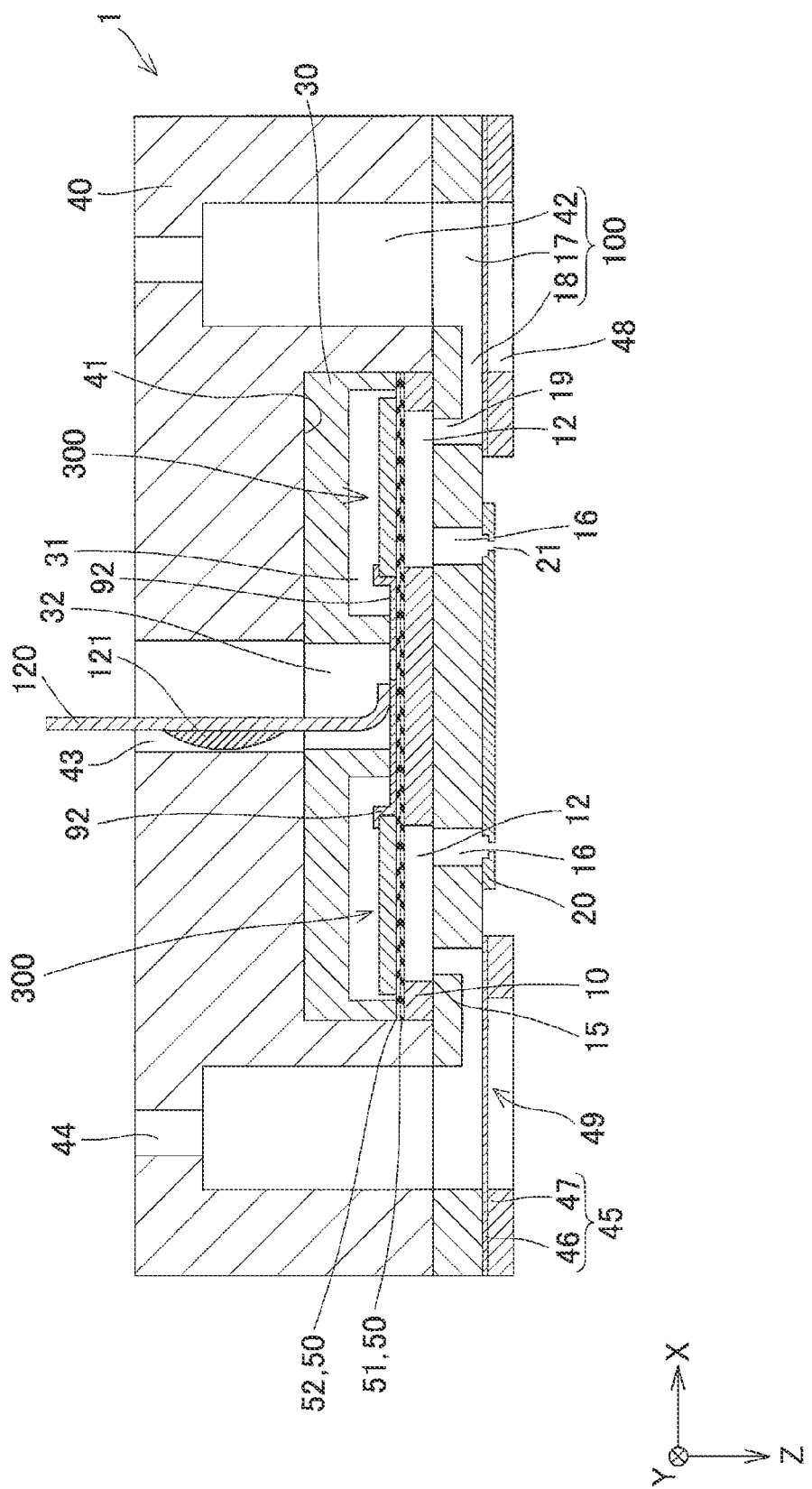
FIG. 3 is a cross-sectional view illustrating the recording head according to First Embodiment.
Figure 4:
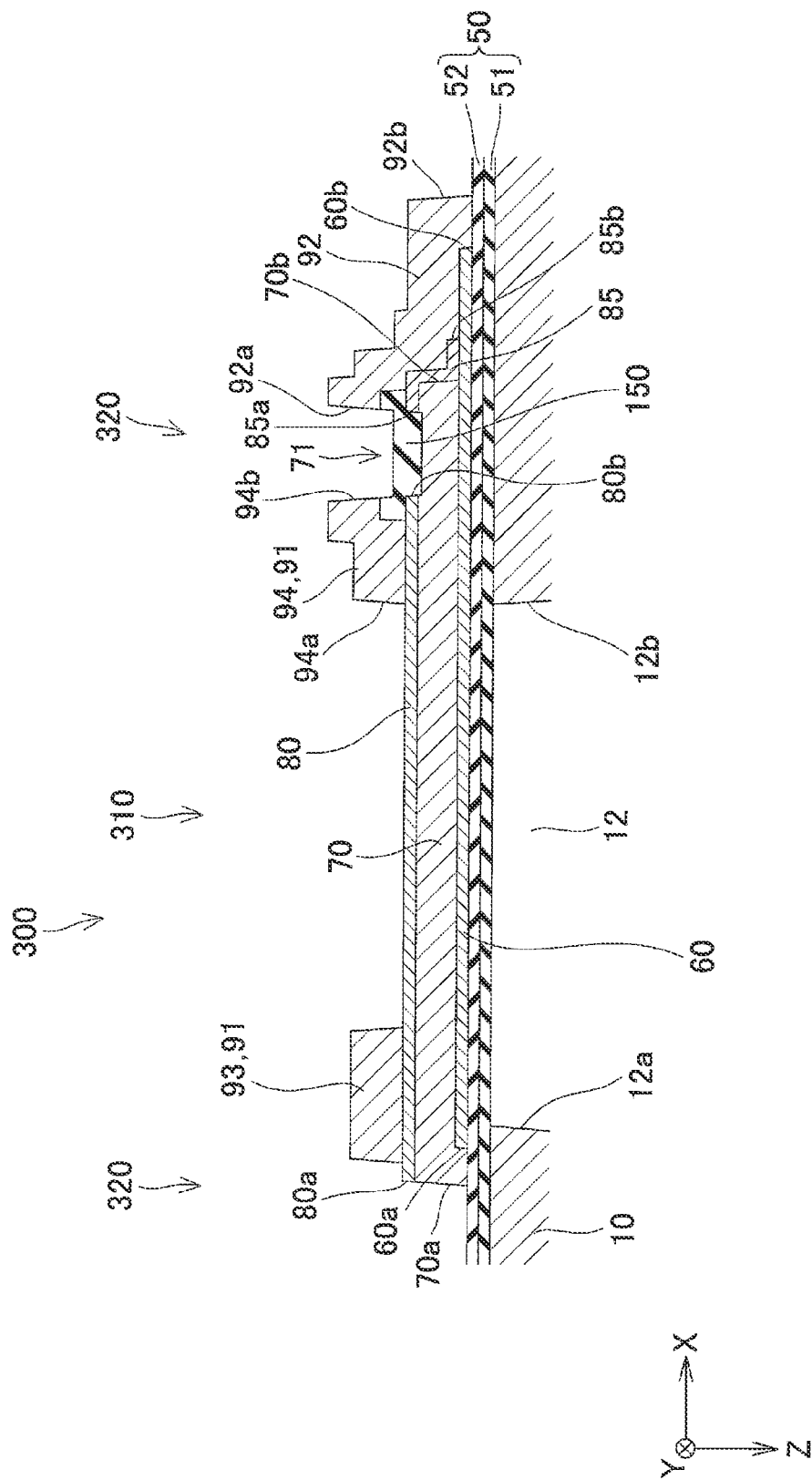
FIG. 4 is a cross-sectional view illustrating an overall configuration of the piezoelectric element according to First Embodiment.
Figure 5:
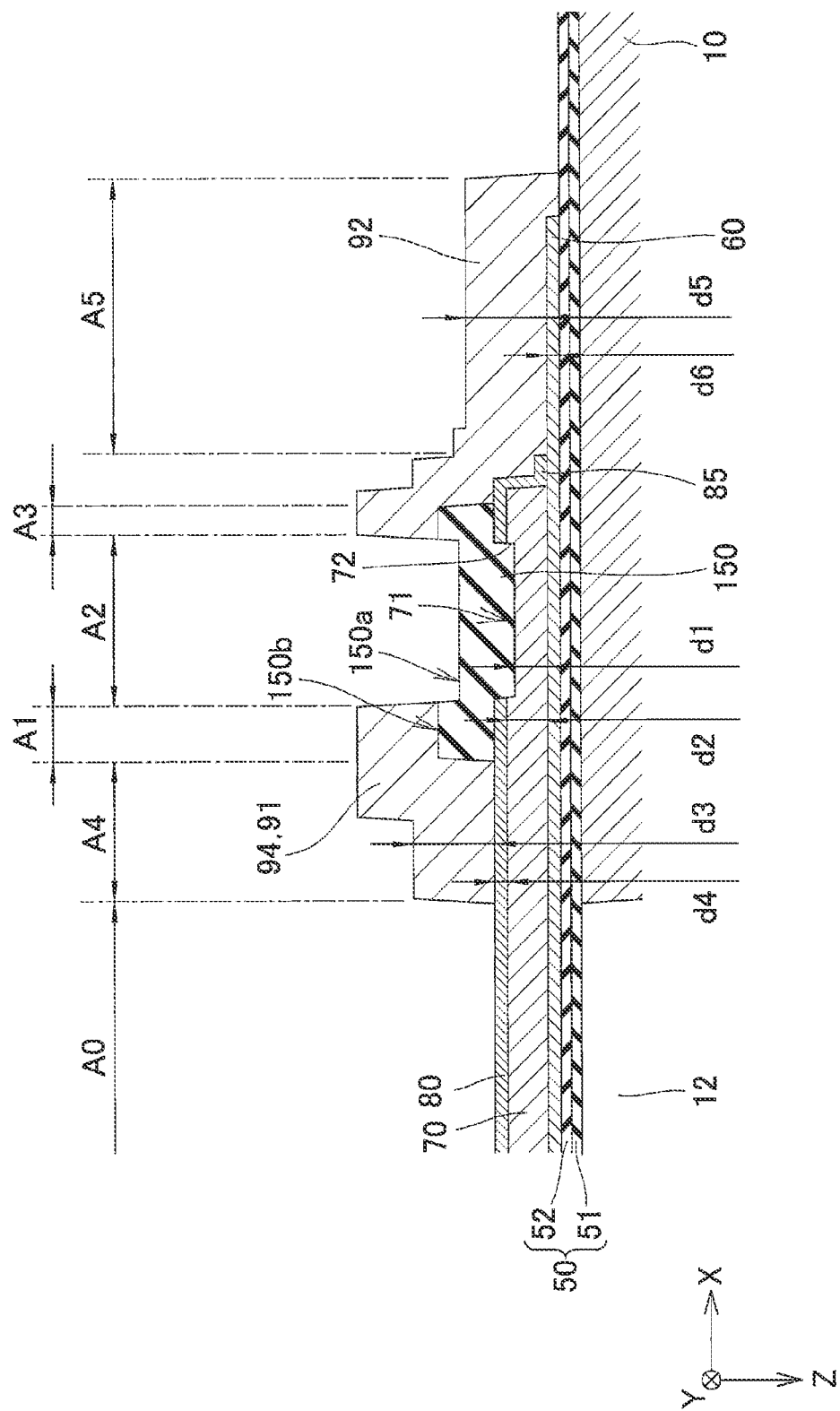
FIG. 5 is a cross-sectional view illustrating main components of the piezoelectric element according to First Embodiment.
Figure 6:
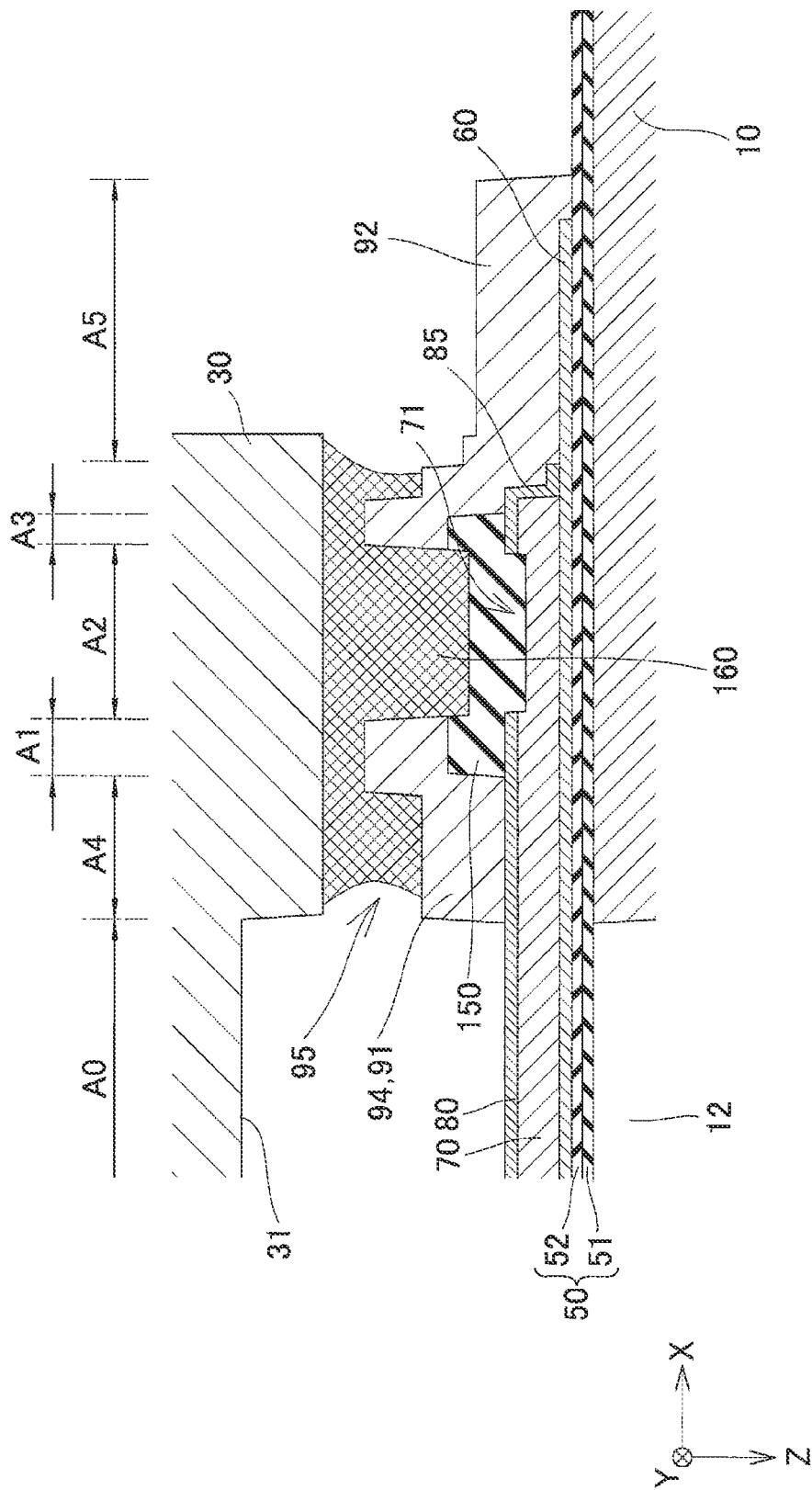
FIG. 6 is a cross-sectional view illustrating main components of the piezoelectric element according to First Embodiment.

FIG. 1 is an exploded perspective view of an ink jet recording head, which is an example of a liquid ejecting head according to First Embodiment of the present disclosure. FIG. 2 is a plan view of a recording head. FIG. 3 illustrates a schematic configuration of the recording head and is a cross-sectional view taken along line III-III in FIG. 2. FIG. 4 is a cross-sectional view illustrating an overall configuration of a piezoelectric element. FIG. 5 illustrates how the components are stacked in each area and is a magnified cross-sectional view illustrating a portion near an end in the X axis direction of the piezoelectric element. FIG. 6 illustrates how the protection plate is attached and is a magnified cross-sectional view illustrating a portion around an end in the X axis direction of the piezoelectric element.

As illustrated in FIGS. 1 to 3, an ink jet recording head (hereinafter, may be simply referred to as a recording head) 1, which is an example of a liquid ejecting head according to this embodiment, ejects ink droplets in the Z axis direction, which is the second direction, more specifically in the +Z direction.

The ink jet recording head 1 includes a pressure chamber plate 10, which is an example of a substrate. The pressure chamber plate 10 may be formed of, for example, a silicon substrate, a glass substrate, an SOI substrate, or any ceramic substrate.

The pressure chamber plate 10 has pressure chambers 12 in the form of recesses, and the pressure chambers 12 form two lines arranged side by side in the X axis direction, which intersects the Z axis direction. In other words, in the pressure chamber plate 10, the pressure chambers 12 that form each line are arranged in the Y axis direction, which intersects the X axis direction.

The pressure chambers 12 that form each line are arranged in a straight line in the Y axis direction at the same position in the X axis direction. The pressure chambers 12 adjacent to each other in the Y axis direction are separated by a partition wall. However, the arrangement of the pressure chambers 12 is not limited to this arrangement. For example, the pressure chambers 12 arranged in the Y axis direction may be in a "staggered arrangement" in which the pressure chambers 12 arranged in the Y axis direction are alternately shifted in the X axis direction.

The pressure chamber 12 in this embodiment is longer in the X axis direction than in the Y axis direction in plan view from the +Z direction and has, for example, a rectangular shape. The shape of the pressure chamber 12 in plan view from the +Z direction is not limited and may be any shape such as a parallelogram, a polygon, a circle, or an oval. Herein, the oval is a shape having a rectangular base and semicircular portions at the ends in the longitudinal direction. Examples of the oval include a rounded rectangle, an ellipse, and an egg-like shape.

A communication plate 15, a nozzle plate 20, and a compliance plate 45 are stacked on the +Z direction side of the pressure chamber plate 10.

The communication plate 15 has nozzle communication passages 16 through which the pressure chambers 12 and nozzles 21 are in communication with each other. The communication plate 15 further has first and second manifold portions 17 and 18 that constitute a manifold 100, which serves as a common liquid chamber in communication with the pressure chambers 12. The first manifold portion 17 extends through the communication plate 15 in the Z axis direction. The second manifold portion 18 does not extend through the communication plate 15 in the Z axis direction and has an opening in the surface facing in the +Z direction.

The communication plate 15 further has supply communication passages 19 provided independently for the respective pressure chambers 12 and in communication with the corresponding pressure chambers 12 at one end in the X axis direction. The supply communication passage 19 allows communication between the second manifold portion 18 and the pressure chamber 12, enabling ink in the manifold 100 to be supplied to the pressure chamber 12.

The communication plate 15 may be formed of, for example, a silicon substrate, a glass substrate, an SOI substrate, any ceramic substrate, or a metal substrate. An example of the metal substrate includes a stainless substrate. The communication plate 15 is preferably formed of a material having substantially the same thermal expansion coefficient as the material of the pressure chamber plate 10.

This can reduce warping of the pressure chamber plate 10 and the communication plate 15 due to a difference in thermal expansion coefficient, which may occur when the pressure chamber plate 10 and the communication plate 15 are subjected to a temperature change.

The nozzle plate 20 is disposed on a surface of the communication plate 15 away from the pressure chamber plate 10 or a surface facing in the +Z direction. The nozzle plate 20 has the nozzles 21 in communication with the pressure chambers 12 through the nozzle communication passages 16.

In this embodiment, the nozzles 21 are arranged in lines in the Y axis direction. In the nozzle plate 20, the nozzles 21 form two nozzle lines arranged side by side in the X axis direction. In other words, the nozzles 21 in each line are located at the same position in the X axis direction. The arrangement of the nozzles 21 is not limited to this. For example, the nozzles 21 arranged in the Y axis direction may be alternately shifted in the X axis direction.

The nozzle plate 20 may be formed of any material and may be formed of, for example, a silicon substrate, a glass substrate, an SOI substrate, any ceramic substrate, or a metal substrate. An example of the metal substrate includes a stainless substrate. The nozzle plate 20 may be formed of an organic substance, such as a polyimide resin. The nozzle plate 20 is preferably formed of a material having substantially the same thermal expansion coefficient as the material of the communication plate 15. This can reduce warping of the nozzle plate 20 and the communication plate 15 due to a difference in thermal expansion coefficient, which may occur when the nozzle plate 20 and the communication plate 15 are subjected to a temperature change.

The compliance plate 45 is disposed on the surface of the communication plate 15 away from the pressure chamber plate 10 or the surface facing in the +Z direction, together with the nozzle plate 20. The compliance plate 45 surrounds the nozzle plate 20 and closes the openings of the first manifolds 17 and the second manifolds 18 in the communication plate 15. In this embodiment, the compliance plate 45 includes a sealing film 46 formed of a flexible thin film and a fixing plate 47 formed of a hard material such as a metal. The fixing plate 47 has openings 48, which are empty spaces extending therethrough in the thickness direction, over areas having the manifolds 100. Thus, the manifolds 100 each have a compliance portion 49, which is sealed only the flexible sealing film 46, on one side.

The vibration plate 50 and the piezoelectric elements 300, which warps the vibration plate 50 to apply pressure to ink in the pressure chamber 12, are disposed on the surface of the pressure chamber plate 10 away from the nozzle plate 20 or the surface facing in the −Z direction (described in detail later). FIG. 3 illustrates the overall configuration of the recording head 1. In FIG. 3, the piezoelectric elements 300 are simplified.

The protection plate 30 having substantially the same size as the pressure chamber plate 10 is also attached to the surface of the pressure chamber plate 10 facing in the −Z direction. The protection plate 30 has holders 31 that are spaces for protecting the piezoelectric elements 300. The holder 31 is provided independently for each of the lines of the piezoelectric elements 300 arranged in the Y axis direction, and two holders 31 are arranged in the X axis direction. Furthermore, the protection plate 30 has a through hole 32 extending therethrough in the Z axis direction between the holders 31, which are arranged in the X axis direction.

A casing 40 that defines the manifolds 100, which are in communication with the pressure chambers 12, together with the pressure chamber plate 10 is fixed to the protection plate 30. The casing 40 has substantially the same shape as the above-described communication plate 15 in plan view in the Z axis direction and is attached to the protection plate 30 and the above-described communication plate 15.

The casing 40 has a housing 41 on the protection plate 30 side and is a space having a depth enough to house the pressure chamber plate 10 and the protection plate 30. The housing 41 has an opening area larger than the surface area of the protection plate 30 attached to the pressure chamber plate 10. The opening of the housing 41 adjacent to the nozzle plate 20 is sealed by the communication plate 15 with the pressure chamber plate 10 and the protection plate 30 being housed in the housing 41.

The casing 40 has third manifolds 42 located outwardly from the housing 41 in the X axis directions. The first and second manifolds 17 and 18 in the communication plate 15 and the third manifolds 42 constitute the manifolds 100 of this embodiment. The manifold 100 extends continuously in the Y axis direction. The supply communication passages 19, which allow communication between the pressure chambers 12 and the manifold 100, are arranged in the Y axis direction.

The casing 40 has inlets 44 that are in communication with the manifolds 100 and through which ink is supplied to the manifolds 100. The casing 40 further has a coupling opening 43 that is in communication with the through hole 32 in the protection plate 30 and through which a wiring board 120 extends.

In the above-described recording head 1 of this embodiment, ink is introduced through the inlet 44 that is coupled to an external ink supplier (not illustrated) to fill the manifold 100 and the nozzle 21. Then, in response to recording signals from the drive circuit 121, a voltage is applied to the piezoelectric elements 300 provided for the respective pressure chambers 12. Thus, the vibration plate 50 is warped together with the piezoelectric elements 300, increasing the pressures in the pressure chambers 12, and thus ink droplets are ejected through the nozzles 21.

Hereinafter, the configuration of the piezoelectric element 300 according to this embodiment will be described. As described above, the piezoelectric element 300 is disposed on a surface of the pressure chamber plate 10 away from the nozzle plate 20 with the vibration plate 50 therebetween. The recording head 1 includes the pressure chamber plate 10, the vibration plate 50 disposed on a surface of the pressure chamber plate 10 facing in the −Z direction, and the piezoelectric elements 300.

As illustrated in FIGS. 4 and 5, the vibration plate 50 includes an elastic film 51 that is formed of silicon oxide and adjacent to the pressure chamber plate 10 and an insulating film 52 that is formed of a zirconium oxide film and located on the elastic film 51. The liquid passages such as the pressure chambers 12 are formed by anisotropic etching on the surface of the pressure chamber plate 10 facing in the +Z direction, and the liquid passages, such as the pressure chambers 12, are covered by the elastic film 51 from the −Z direction side.

The elastic film 51 may be integral with the pressure chamber plate 10. More specifically, for example, the pressure chamber plate 10 may be formed of silicon, and the surface may be thermally oxidized to form a silicon oxide layer. The silicon oxide layer may be used as the elastic film 51.

The configuration of the vibration plate 50 is not limited to the above. The vibration plate 50 may only include one of the elastic film 51 and the insulating film 52, for example, or may further include a film other than the elastic film 51 and the insulating film 52. The other film may be formed of silicon or silicon nitride, for example.

The piezoelectric element 300 is a pressure generator that applies pressure to the ink in the pressure chamber 12 and may be called a piezoelectric actuator. The piezoelectric element 300 includes a first electrode 60, a piezoelectric layer 70, and a second electrode 80, which are stacked on top of another in this order from the +Z direction side, or the vibration plate 50 side, to the −Z direction side.

The piezoelectric element 300 has a portion called an operative portion 310 in which the piezoelectric layer 70 is subjected to piezoelectric strain when a voltage is applied between the first electrode 60 and the second electrode 80. The piezoelectric element 300 further has a portion called an inoperative portion 320 in which the piezoelectric layer 70 is not subjected to piezoelectric strain. In other words, the portion of the piezoelectric element 300 in which the piezoelectric layer 70 is sandwiched between the first electrode 60 and the second electrode 80 is the operative portion 310, and the portion in which the piezoelectric layer 70 is not sandwiched between the first electrode 60 and the second electrode 80 is the inoperative portion 320.

Furthermore, a portion that is actually deformed in the Z axis direction when the piezoelectric element 300 is driven is called a flexible portion, and a portion that is not deformed in the Z axis direction is called a non-flexible portion. In other words, in the operative portion 310 of the piezoelectric element 300, a portion that faces the pressure chamber 12 in the Z axis direction is the flexible portion and a portion that is located outwardly from the pressure chamber 12 is the non-flexible portion.

Typically, one of the electrodes of the operative portion 310 is an individual electrode provided independently for each of the piezoelectric elements 300 and the other is a common electrode shared by the piezoelectric elements 300. In this embodiment, the first electrode 60 is the individual electrode, and the second electrode 80 is the common electrode.

The first electrodes 60 are cut pieces separated for the pressure chambers 12 and are individual electrodes provided independently for the respective operative portions 310. The first electrode 60 has a smaller width in the Y axis direction than the pressure chamber 12. In other words, the ends in the Y axis direction of the first electrode 60 are in the area facing the pressure chamber 12.

The first electrode 60 extends in the X axis direction over an area facing the pressure chamber 12 beyond the pressure chamber 12. In the cross-sectional view of FIG. 4, an end 60a in the −X direction and an end 60b in the +X direction of the first electrode 60 are located outwardly from the pressure chamber 12. In other words, the end 60a in the −X direction of the first electrode 60 is located away in the −X direction from an end 12a in the −X direction of the pressure chamber 12. The end 60b in the +X direction of the first electrode 60 is located away in the +X direction from an end 12b in the +X direction of the pressure chamber 12.

The first electrode 60 may be formed of any material and may be formed of an electrically conductive material including metals, such as iridium and platinum, and electrically conductive metal oxides, such as indium tin oxide (abbreviated as ITO).

The piezoelectric layer 70 having a predetermined length in the X axis direction extends continuously in the Y axis direction. In other words, the piezoelectric layer 70 having a predetermined thickness extends continuously in the arrangement direction of the pressure chambers 12. The thickness of the piezoelectric layer 70 is not limited but may be within a range of about 1 to 4 μm. The piezoelectric layer 70 may be discontinuous in the arrangement direction of the pressure chambers 12. For example, the piezoelectric layer 70 may have a cutout in each area between the pressure chambers 12.

The length in the X axis direction of the piezoelectric layer 70 is longer than the length in the X axis direction or the longitudinal direction of the pressure chamber 12. The piezoelectric layer 70 extends beyond the ends in the X axis direction of the pressure chamber 12. Furthermore, in FIG. 4, an end 70a in the −X direction of the piezoelectric layer 70 is located outwardly from the end 60a in the −X direction of the first electrode 60. In other words, the piezoelectric layer 70 covers the end 60a of the first electrode 60. In contrast, an end 70b in the +X direction of the piezoelectric layer 70 is located inwardly from the end 60b in the +X direction of the first electrode 60, or closer to the pressure chamber 12. The piezoelectric layer 70 does not cover the end 60b of the first electrode 60.

The piezoelectric layer 70 may be a perovskite-structure crystal film (a perovskite crystal) formed of a ferroelectric ceramic material exhibiting an electromechanical transducing action and located on the first electrode 60. The piezoelectric layer 70 may be formed of a ferroelectric piezoelectric material, such as lead zirconate titanate (PZT) or a material including the ferroelectric piezoelectric material and a metal oxide, such as niobium oxide, nickel oxide, and magnesium oxide. Specific examples of the material include lead titanate ($PbTiO_3$), lead zirconate titanate ($Pb(Zr, Ti)O_3$), lead zirconate ($PbZrO_3$), lead lanthanum titanate (($Pb, La$), $TiO_3$), lead lanthanum zirconate titanate (($Pb, La$) ($Zr, Ti)O_3$), and lead zirconate titanate magnesium niobate ($Pb(Zr, Ti)$ ($Mg, Nb)O_3$). In this embodiment, the piezoelectric layer 70 is formed of lead zirconate titanate (PZT).

The material of the piezoelectric layer 70 is not limited to a lead-based piezoelectric material including lead and may be a non-lead-based piezoelectric material not including lead. Examples of the non-lead-based piezoelectric material include bismuth ferrate (($BiFeO_3$), abbreviated as "BFO"), barium titanate (($BaTiO_3$), abbreviated as "BT"), sodium potassium niobate (($K, Na$) ($NbO_3$), abbreviated as "KNN"), lithium sodium potassium niobate (($K, Na, Li$) ($NbO_3$)), lithium sodium potassium tantalate niobate (($K, Na, Li$) ($Nb, Ta)O_3$), bismuth potassium titanate (($Bi_{1/2}K_{1/2})TiO_3$, abbreviated as "BKT"), sodium bismuth titanate (($Bi_{1/2}Na_{1/2}$) $TiO_3$, abbreviated as "BNT"), bismuth manganate ($BiMnO_3$, abbreviated as "BM"), a composite oxide including bismuth, potassium, titanium, and iron and having a perovskite structure ($x[(Bi_xK_{1-x})TiO_3]-(1-x)$ $[BiFeO_3]$, abbreviated as "BKT-BF"), a composite oxide including bismuth, iron, barium, and titanium and having a perovskite structure (($1-x$) $[BiFeO_3]-x[BaTiO_3]$, abbreviated as "BFO-BT"), and a material including the composite oxide and a metal such as manganese, cobalt, and chromium (($1-x$) $[Bi(Fe_{1-y}My)O_3]-x[BaTiO_3]$ (M represents Mn, Co, or Cr)).

The second electrode 80 is disposed on the surface of the piezoelectric layer 70 away from the first electrode 60 or the surface facing in the −Z direction and is the common electrode shared by the multiple piezoelectric elements 300. The second electrode 80 having a predetermined length in the X axis direction extends continuously in the Y axis direction.

In FIG. 4, an end 80a in the −X direction of the second electrode 80 is located outwardly from the end 60a of the first electrode 60 covered by the piezoelectric layer 70. In other words, the end 80a of the second electrode 80 is located outwardly from the end 60a of the first electrode 60 and the end 12a in the +X direction of the pressure chamber 12. Thus, the end in the −X direction of the operative portion 310 or the border between the operative portion 310 and the inoperative portion 320 is defined by the end 60a of the first electrode 60.

In contrast, in FIG. 4, an end 80b in the +X direction of the second electrode 80 is located outwardly from the end 12b in the +X direction of the pressure chamber 12 and is located inwardly from the end 70b in the +X direction of the piezoelectric layer 70. As described above, the end 70b of the piezoelectric layer 70 is located inwardly from the end 60b of the first electrode 60. Thus, the end 80b of the second electrode 80 is located inwardly from the end 60b of the first electrode 60 and on the piezoelectric layer 70.

As described above, the end 80b of the second electrode 80 is located away in the −X direction from the ends 60b and 70b in the +X direction of the first electrode 60 and the piezoelectric layer 70. Thus, the end in the +X direction of the operative portion 310 or the border between the operative portion 310 and the inoperative portion 320 is defined by the end 80b of the second electrode 80. An exposed portion 71 where the piezoelectric layer 70 is exposed is located outwardly from the end 80b of the second electrode 80.

The second electrode 80 may be formed of any material, as the first electrode 60, and may be preferably formed of an electrically conductive material. Examples thereof include metals, such as iridium, and platinum, and electrically conductive metal oxides, such as indium tin oxide.

A wiring layer 85 is not in contact with the end of the second electrode 80 with a space therebetween, i.e., is disposed away in the +X direction from the end 80b of the second electrode 80. The wiring layer 85 is in the same layer as the second electrode 80 but electrically discontinuous from the second electrode 80.

The wiring layer 85 is spaced apart from the end of the second electrode 80 and is disposed on a portion of the piezoelectric layer 70 and a portion of the first electrode 60 extending in the +X direction from the piezoelectric layer 70. The wiring layer 85 is provided independently for each of the operative portions 310. In other words, multiple wiring layers 85 are arranged in the Y axis direction at a predetermined interval.

As described above, on the piezoelectric layer 70 constituting the piezoelectric element 300, the second electrode 80 and the wiring layer 85 are spaced apart from each other in the X axis direction. In the space between the second electrode 80 and the wiring layer 85, the surface of the piezoelectric layer 70 is exposed. In other words, the piezoelectric layer 70 constituting the piezoelectric element 300 has a portion located between the second electrode 80 and the wiring layer 85, and the portion is the exposed portion 71 where the surface away from the pressure chamber plate 10 is not covered by the second electrode 80 and the wiring layer 85.

Here, the thickness d1 of the piezoelectric layer 70 at the exposed portion 71 is smaller than the thickness d2 of the piezoelectric layer 70 at the other portion (see FIG. 5). In other words, at the exposed portion 71, the piezoelectric layer 70 has a recess 72, which is a thinly removed superficial portion.

The exposed portion 71 of the piezoelectric layer 70 is covered by the insulating layer 150 formed of an insulating material. The insulating layer 150 on the second electrode 80 continuously extends in the X axis direction onto the wiring layer 85. The insulating layer 150 covers the end 80b of the second electrode 80 and an end 85a in the −X direction of the wiring layer 85 (FIG. 4), in addition to the exposed portion 71 of the piezoelectric layer 70. In other words, the insulating layer 150 has a portion overlapping the end 80b of the second electrode 80 and the end 85a of the wiring layer 85 in the X axis direction.

The insulating layer 150 extends continuously in the Y axis direction over the area having the piezoelectric elements 300. This readily improves moisture barrier properties. However, the insulating layer 150 only needs to cover at least a portion of the exposed portion 71 of the piezoelectric layer 70 located between the second electrode and the wiring layer 85 and may be provided independently for each of the piezoelectric elements 300.

The insulating layer 150 may be formed of any material having electrical insulating properties and moisture barrier properties. Examples of the material include photosensitive resin such as polyimide. When photosensitive resin is employed, the second electrode 80 is formed and treated with heat, and then the insulating layer 150 is formed by photolithography. The insulating layer 150 may be formed of an inorganic insulating material such as aluminum oxide. In this case, for example, the insulating layer 150 is formed over the entire surface by sputtering through a mask, and then lift-off is performed to form the insulating layer 150 only in a desired area.

The common lead electrode 91, which is the first conductive layer, is coupled to the second electrode 80, which constitutes the piezoelectric element 300. The individual lead electrode 92, which is the second conductive layer, is coupled to the first electrode 60, which constitutes the piezoelectric element 300. The flexible wiring board 120 is coupled to the end of the common lead electrode 91 and the end of the individual lead electrode 92, which are opposite from the ends coupled to the piezoelectric element 300.

In this embodiment, the common lead electrode 91 and the individual lead electrode 92 extending to the through hole 32 in the protection plate 30 are exposed and electrically coupled to the wiring board 120 in this through hole 32. A drive circuit 121 having switching elements for driving the piezoelectric elements 300 is mounted on the wiring board 120.

The common lead electrode 91 and the individual lead electrodes 92 may be formed of any conductive material. Examples of the material include gold (Au), platinum (Pt), aluminum (Al), and copper (Cu). In this embodiment, gold (Au) is used as the common lead electrode 91 and the individual lead electrodes 92. The common lead electrode 91 and the individual lead electrodes 92 may include an adhesion layer formed of nickel chromium (NiCr) or the like to improve adhesion with the first electrode 60, the second electrode 80, and the vibration plate 50.

The thickness d3 of the common lead electrode 91 is not limited, but in this embodiment, the thickness d3 is larger than the thickness d4 of the second electrode 80 to which the common lead electrode 91 is coupled (see FIG. 5). Similarly, the thickness d5 of the individual lead electrode 92 is not limited, but in this embodiment, the thickness d5 is larger than the thickness d6 of the first electrode 60 to which the individual lead electrode 92 is coupled.

The common lead electrode 91 on the second electrode 80, which constitutes the common electrode on the piezoelectric layer 70, extends, at the ends in the Y axis direction, in the X axis direction onto the vibration plate 50. The common lead electrode 91, which is the first conductive layer, has a first auxiliary wiring portion 93 extending in the Y axis direction, near the end 12a in the −X direction of the pressure chamber 12 in FIG. 4. Furthermore, the common lead electrode 91 has a second auxiliary wiring portion 94 extending in the Y axis direction in an area having the ends 12b in the +X direction of the pressure chambers 12. The first and second auxiliary wiring portions 93 and 94 continuously extend in the Y axis direction over the piezoelectric elements 300.

Here, the second electrode 80, which is thin, has high electrical resistance and is likely to have uneven electric charge distribution. To solve this problem, the first and second auxiliary wiring portions 93 and 94 having relatively low electrical resistance are provided on the second electrode 80. This reduces the unevenness of electric charge distribution. This can reduce the variation in the amount of deformation of the driven multiple piezoelectric elements 300.

The second auxiliary wiring portion 94 of the common lead electrode 91 is located outwardly from the pressure chamber 12 in the X axis direction. In this embodiment, the operative portion 310 of the piezoelectric element 300 extends to the outside of the pressure chamber 12 beyond each end in the X axis direction of the pressure chamber 12, and the second auxiliary wiring portion 94 extends on the operative portion 310, or the second electrode 80, to the insulating layer 150. For example, in FIG. 4, an end 94a in the −X direction of the second auxiliary wiring portion 94 is located near the end 12b of the pressure chamber 12, and an end 94b in the +X direction thereof is located on the insulating layer 150. The end 94a of the second auxiliary wiring portion 94 may be located in the area facing the pressure chamber 12.

In contrast, the individual lead electrode 92 is provided independently for each of the piezoelectric elements 300, i.e., for each of the first electrodes 60. In FIG. 4, the individual lead electrode 92 is coupled to a portion of the first electrode 60 near the end 60b in the +X direction, which extends outwardly from the piezoelectric layer 70, via the wiring layer 85. An end of the individual lead electrode 92 extends in the X axis direction onto the pressure chamber plate 10, specifically onto the vibration plate 50. The other end of the individual lead electrode 92 extends in the X axis direction to the insulating layer 150. For example, in FIG. 4, the individual lead electrode 92 has an end 92a in the −X direction on the insulating layer 150 and an end 92b in the +X direction on the vibration plate 50.

The common lead electrode 91 and the individual lead electrode 92, which have the ends on the insulating layer 150, are preferably formed by electroless plating, for example, when the insulating layer 150 is formed of photosensitive resin. If the common lead electrode 91 and the individual lead electrode 92 are formed by electrolytic plating, the insulating layer 150 may be damaged.

As described above, on the −Z direction side of the pressure chamber plate 10, the piezoelectric element 300 including the vibration plate 50, the first electrode 60, the piezoelectric layer 70, and the second electrode 80, the common lead electrode 91 (second auxiliary wiring portion 94), which is the first conductive layer, the individual lead electrodes 92, which is the second conductive layer, and the insulating layer 150, are stacked in a predetermined order in each area.

More specifically, as illustrated in FIG. 5, the vibration plate 50, the first electrode 60, the piezoelectric layer 70, and the second electrode 80 are stacked in this order from the pressure chamber plate 10 side, in an active area A0 facing the pressure chamber 12. The area located outwardly from the active area A0 in the X axis direction, which is the longitudinal direction of the pressure chamber 12, such as the area on the +X direction side of the active area A0, includes a first area A1, a second area A2, a third area A3, a fourth area A4, and a fifth area A5.

In the first area A1, the vibration plate 50, the first electrode 60, the piezoelectric layer 70, the second electrode 80, the insulating layer 150, and the second auxiliary wiring portion 94 (91), which is the first conductive layer, are stacked in this order from the pressure chamber plate 10 side.

The first area A1 in this embodiment has the vibration plate 50 and the first electrode 60 but does not necessarily have to include them. At least one of the vibration plate 50 and the first electrode 60 may be eliminated from the first area A1. In the first area A1, the insulating layer 150 is preferably thicker than the second electrode 80, and the second auxiliary wiring portion 94 (91) is preferably thicker than the insulating layer 150.

In the second area A2, the vibration plate 50, the first electrode 60, the piezoelectric layer 70, and the insulating layer 150 are stacked in this order from the pressure chamber plate 10 side, without the second electrode 80 and second auxiliary wiring portion 94 (91). In this embodiment, the second area A2 is the area having the exposed portion 71 of the piezoelectric layer 70 and is located on the opposite side of the first area A1 from the pressure chamber 12. In other words, the first area A1 is located on the side of the second area A2 adjacent to the pressure chamber 12, e.g., is located adjacent to the second area A2 in the −X direction in FIG. 5. The second area A2 in this embodiment includes the vibration plate 50 and the first electrode 60 but does not necessarily have to include them. At least one of the vibration plate 50 and the first electrode 60 may be eliminated from the second area A2.

Here, a surface 150a of the insulating layer 150 away from the pressure chamber plate 10 in the second area A2 is closer to the pressure chamber plate 10 than a surface 150b of the insulating layer 150 away from the pressure chamber plate 10 in the first area A1. For example, over-etching in the patterning of the common lead electrode 91 makes the surface 150a of the insulating layer 150 to be located closer to the pressure chamber plate 10 than the surface 150b. Thus, the insulating layer 150 in the second area A2 has a smaller thickness than the insulating layer 150 in the first area A1. The location of the surface of the insulating layer 150 in each area is not limited. The insulating layer 150 may have a flat entire surface.

The third area A3 is adjacent to the second area A2. In the third area A3, the vibration plate 50, the first electrode 60, the piezoelectric layer 70, the wiring layer 85, the insulating layer 150, and the individual lead electrode 92 are stacked in this order from the pressure chamber plate 10 side. In FIG. 5, the third area A3 is adjacent to the second area A2 in the +X direction. In the X axis direction, the second area A2 is located between the first area A1 and the third area A3. The dimension of the first area A1 in the X axis direction is not limited, but the first area A1 is preferably larger in the X axis direction than the third area A3.

The fourth area A4 is adjacent to the first area A1. In the fourth area A4, the vibration plate 50, the first electrode 60, the piezoelectric layer 70, the second electrode 80, and the second auxiliary wiring portion 94 (91) are stacked in this order from the pressure chamber plate 10 side, without the insulating layer 150. In other words, in the fourth area A4, the second electrode 80 and the second auxiliary wiring portion 94 (91) are electrically coupled to each other.

In this embodiment, the area between the first area A1 and the active area A0 in the X axis direction is the fourth area A4. In other words, in the X axis direction, the first area A1 is located between the fourth area A4 and the second area A2. The dimension of the fourth area A4 in the X axis direction is not limited, but the fourth area A4 is preferably larger in the X axis direction than the first area A1.

In the fifth area A5, the vibration plate 50, the first electrode 60, and the individual lead electrodes 92 are stacked in this order from the pressure chamber plate 10 side, without the piezoelectric layer 70, the wiring layer and the insulating layer 150. The fifth area A5 is on the opposite side of the third area A3 from the pressure chamber 12.

As described above, the recording head 1 has the protection plate 30 defining the holders 31, which are spaces housing the piezoelectric elements 300. The protection plate 30 is attached to the pressure chamber plate 10 and other components with an adhesive. In this embodiment, as illustrated in FIG. 6, the protection plate is attached to the insulating layer 150 with an adhesive 160 in the second area A2.

During the attachment, the protection plate 30 is pressed in the Z axis direction. This may push out the adhesive from between the protection plate 30 and the common lead electrode 91 and between the protection plate 30 and the individual lead electrode 92, and thus the protection plate 30 may be substantially in contact with the common lead electrode 91 and the individual lead electrode 92 in the first and third areas A1 and A3.

The protection plate 30 is attached to the second auxiliary wiring portion 94 (91) in the first area A1 with the adhesive 160. The second auxiliary wiring portion 94 (91), to which the protection plate 30 is attached, has a stepped portion 95 having different heights in the Z axis direction in an area extending from the first area A1 to the fourth area A4. During the attachment of the protection plate 30, an extra portion of the adhesive 160 accumulates on this stepped portion 95, and thus the adhesive 160 is less likely to flow toward the operative portion 310.

As described above, the vibration plate 50, the first electrode 60, the piezoelectric layer 70, the second electrode 80, the second auxiliary wiring portion 94 (91), the individual lead electrode 92, and the insulating layer 150 are stacked in a predetermined order in each of the areas. This can reduce damage or the like to the piezoelectric layer 70 at the portion corresponding to the exposed portion 71.

Specifically, the exposed portion 71 of the piezoelectric layer 70 is covered by the insulating layer 150 in the second area A2. This can reduce entry of moisture into the piezoelectric layer 70. Furthermore, the common lead electrode 91 is located on the insulating layer 150 in the first area A1, and the end of the individual lead electrode 92 is located on the insulating layer 150 in the third area A3. This can improve the insulating properties between the common lead electrode 91 and the individual lead electrode 92 and reduce a short circuit caused by migration.

In particular, the surface 150a of the insulating layer 150 in the second area A2 is located closer to the pressure chamber plate 10 than the surface 150b in the first area A1, and thus the migration path between the common lead electrode 91 and the individual lead electrode 92 is long. This reduces a short circuit caused by migration. Furthermore, in the manufacturing process, the residue of the common lead electrode 91 and the residue of the individual lead electrode 92 can be reliably removed from the second area A2. Thus, a short circuit caused by migration is less likely to occur.

Furthermore, the insulating layer 150 is on the exposed portion 71, which corresponds to the border between the operative portion 310 and the inoperative portion 320 of the piezoelectric element 300. This reduces mechanical damage to the piezoelectric layer 70 at the border. This results in reduction of damage to the piezoelectric layer 70. Furthermore, the insulating layer 150 does not cover the entire operative portion 310 of the piezoelectric element 300 but covers a portion of the operative portion 310, and thus the amount of deformation of the piezoelectric element 300 is less likely to be reduced.

As described above, the recording head 1 in this embodiment includes the piezoelectric element 300, which includes the first electrode 60, the piezoelectric layer 70, and the second electrode 80, the common lead electrode 91, which is the first conductive layer electrically coupled to the second electrode 80, the insulating layer 150, which is formed of an insulating material, the vibration plate 50, which is vibrated when the piezoelectric element 300 is driven, and the pressure chamber plate 10, which defines the pressure chamber 12 that applies pressure to a liquid when the vibration plate 50 is vibrated.

In the active area A0 facing the pressure chamber 12, the vibration plate 50, the first electrode 60, the piezoelectric layer 70, and the second electrode 80 are stacked in this order from the pressure chamber plate 10 side. The area located outwardly from the active area A0 in the X axis direction, which is the longitudinal direction of the pressure chamber 12, includes the first area A1 in which the piezoelectric layer 70, the second electrode 80, the insulating layer 150, and the second auxiliary wiring portion 94 (91), which is the first conductive layer, are stacked in this order in the −Z direction, and the second area A2 in which the piezoelectric layer 70 and the insulating layer 150 are stacked in this order in the −Z direction, without the second electrode 80 (including the wiring layer 85) and the second auxiliary wiring portion 94.

Compared to a known configuration described below, this configuration improves the adhesion of the insulating layer 150 at a portion corresponding to the exposed portion 71 and reduces damage to the piezoelectric layer 70.

In a known configuration, the piezoelectric layer 70, the second electrode 80, the second auxiliary wiring portion 94 (91), and the insulating layer 150 are stacked in this order in the −Z direction in an adjacent area adjacent to the second area A2 (corresponding to the first area A1 of this disclosure). In other words, in the known configuration, the insulating layer 150 is located on the −Z direction side of the second auxiliary wiring portion 94 (91) in the above adjacent area.

In this known configuration, the adhesion between the exposed portion 71 of the surface of the piezoelectric layer 70 and the insulating layer 150 may be lower. This defect is caused by a difference in height level of the insulating layer 150 at the border between the second area A2 not having the second auxiliary wiring portion 94 (91) and the above-described adjacent area having the second auxiliary wiring portion 94 (91). In other words, the defect is caused when the height of the insulating layer 150 in the Z axis direction largely varies between the second area A2 and the above-described adjacent area.

If the insulating layer 150 has a large difference in height level at the border between the second area A2 and the above-described adjacent area, uneven spin-coating or poor resist adhesion may readily occur in the formation process of the insulating layer 150. The insulating layer 150 cannot be stably formed by a general method in some cases.

In view of the above, the configuration of the present disclosure includes the first area A1 in which the piezoelectric layer 70, the second electrode 80, the insulating layer 150, and the second auxiliary wiring portion 94 (91), which is the first conductive layer, are stacked in this order in the −Z direction and the second area A2 in which the piezoelectric layer 70 and the insulating layer 150 are stacked in this order in the −Z direction without the second electrode 80 (including the wiring layer 85) and the second auxiliary wiring portion 94. This can improve the adhesion of the insulating layer 150 and can reduce damage to the piezoelectric layer 70.

Here, the second auxiliary wiring portion 94 (91), which is the first conductive layer, has a larger thickness than the second electrode 80. The thick first conductive layer has lower electrical resistance and reduces unevenness of electric charge distribution at the second electrode 80, and the second electrode 80 having a relatively small thickness allows efficient deformation of the flexible portion of the piezoelectric element 300. Furthermore, in the present disclosure, the insulating layer 150 is located on the +Z direction side of the second auxiliary wiring portion 94 (91) in the first area A1. Even when the second auxiliary wiring portion 94 (91) is relatively thick, this can improve the adhesion of the insulating layer 150 at the portion corresponding to the exposed portion 71 and can reduce damage to the piezoelectric layer 70.

The surface 150a of the insulating layer 150 away from the pressure chamber plate 10 in the second area A2 is closer to the pressure chamber plate 10 than is the surface 150b of the insulating layer 150 away from the pressure chamber plate 10 in the first area A1. In this configuration, the migration path between the common lead electrode 91 on the insulating layer 150 and, for example, the individual lead electrode 92 is longer than a migration path in a configuration in which the surface 150a of the insulating layer 150 away from the pressure chamber plate 10 in the second area A2 and the surface 150b of the insulating layer 150 away from the pressure chamber plate 10 in the first area A1 are located at the same position in the Z axis direction. This reduces a short circuit between the common lead electrode 91 and the individual lead electrode 92 caused by migration. Furthermore, in the manufacturing process, the residue of the common lead electrode 91 and the residue of the individual lead electrode 92 can be reliably removed from the second area A2. Thus, a short circuit caused by migration is less likely to occur.

The piezoelectric layer 70 has a smaller thickness in the second area A2 than in the first area A1. This increases the difference in height between the surface 150a of the insulating layer 150 in the second area A2 and the surface 150b of the insulating layer 150 in the first area A1. This further reduces a short circuit between the common lead electrode 91 and, for example, the individual lead electrode 92, which is caused by migration. Furthermore, in the manufacturing process, a piezoelectric layer having low insulating properties and formed near the interface between the piezoelectric layer 70 and the second electrode 80 can be reliably removed. This can more reliably reduce a short circuit.

The area adjacent to the second area A2 includes the third area A3 in which the insulating layer 150 and the individual lead electrode 92, which is the second conductive layer electrically coupled to the first electrode 60, are stacked. The second area A2 is located between the first area A1 and the third area A3 in the longitudinal direction of the pressure chamber 12. This configuration reduces a short circuit between the common lead electrode 91 and the individual lead electrode 92 caused by migration.

The individual lead electrode 92, which is the second conductive layer, has a larger thickness than the first electrode 60. According to the present disclosure, even when the individual lead electrode 92 has a relatively large thickness, damage to the piezoelectric layer 70 at the portion corresponding to the exposed portion 71 can be reduced.

The area adjacent to the first area A1 includes the fourth area A4 in which the piezoelectric layer 70, the second electrode 80, and the second auxiliary wiring portion 94 are stacked in this order in the −Z direction. The first area A1 is located between the fourth area A4 and the second area A2 in the X axis direction, which is the longitudinal direction of the pressure chamber 12. In the configuration including the fourth area A4, damage to the piezoelectric layer 70 at the portion corresponding to the exposed portion 71 is reduced.

The first area A1 is wider than the third area A3 in the X axis direction, which is the longitudinal direction of the pressure chamber 12. This improves reliability. The fourth area A4 and the first area A1 are included in the operative portion 310. The fourth area A4 where the second auxiliary wiring portion 94 is directly located on the second electrode 80 has a relatively large potential difference between the second electrode 80 and the first electrode 60. In the first area A1, the second auxiliary wiring portion 94 is not directly located on the second electrode 80, and the potential difference between the second electrode 80 and the first electrode 60 is relatively small. The third area A3 is the inoperative portion 320.

In the configuration of the present embodiment, the first area A1, which is the operative portion 310 having a relatively small potential difference between the electrodes, is located between the fourth area A4, which is the operative portion 310 having a relatively large potential difference between the electrodes, and the third area A3, which is the inoperative portion 320.

Thus, the first area A1 functions as a buffer area between the fourth area A4 and the third area A3. The first area A1, which functions as a buffer area, has a relatively large area, and thus cracking of the piezoelectric layer 70 is more reliably reduced.

In the X axis direction, which is the longitudinal direction of the pressure chamber 12, the fourth area A4 is wider than the first area A1. This configuration can lower the resistance of the second electrode 80 by using the second auxiliary wiring portion 94 and also can downsize the recording head 1.

This configuration further includes the protection plate 30 defining the spaces housing the piezoelectric elements 300, and the protection plate 30 is coupled to the insulating layer 150 in the second area A2 with the adhesive 160. In this configuration, the adhesive 160 improves the insulating properties at the exposed portion 71 of the piezoelectric layer 70.

The area adjacent to the first area A1 includes the fourth area A4 in which the piezoelectric layer 70, the second electrode 80, and the second auxiliary wiring portion 94 (91), which is the first conductive layer, are stacked in this order in the −Z direction. The first area A1 is located between the fourth area A4 and the second area A2 in the X axis direction, which is the longitudinal direction of the pressure chamber 12. The second auxiliary wiring portion 94 (91), which is the first conductive layer, has the stepped portion 95 in an area extending from the first area A1 to the fourth area A4. The protection plate 30 is coupled to the second auxiliary wiring portion 94 (91), which is the first conductive layer, with an adhesive 160 in the first area A1.

With this configuration, during the attachment of the protection plate 30, an extra portion of the adhesive accumulates on this stepped portion 95, and thus the adhesive is less likely to flow toward the operative portion 310. This reduces the possibility that, for example, an adhesive will attach to the operative portion 310 and the attached adhesive will affect the deformation properties of the vibration plate 50 and the ejection properties of the recording head 1.

Second Embodiment

Figure 7:
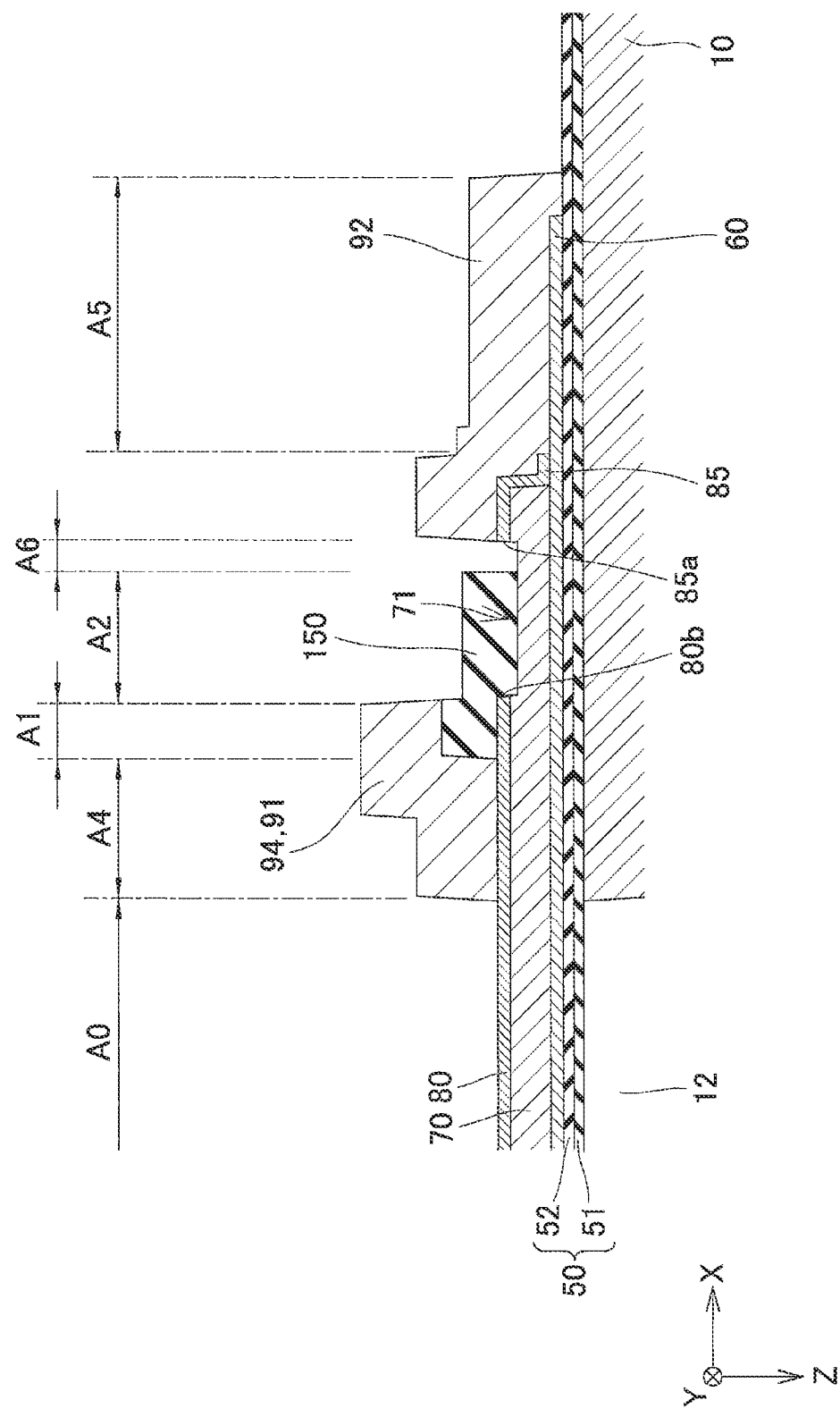
FIG. 7 is a cross-sectional view illustrating main components of a piezoelectric element according to Second Embodiment.

FIG. 7 is a magnified cross-sectional view illustrating main components of a recording head according to a second embodiment. This embodiment is a modification of the stack structure including the vibration plate 50, the first electrode 60, the piezoelectric layer 70, the second electrode 80 (including the wiring layer 85), the second auxiliary wiring portion 94 of the common lead electrode 91, which is the first conductive layer, the individual lead electrode 92, which is the second conductive layer, and the insulating layer 150, in the area located outwardly from the pressure chamber 12. Other configurations in this embodiment are the same as those in First Embodiment. The same reference numerals are assigned to the same components as First Embodiment without duplicated explanation.

Specifically, as illustrated in FIG. 7, the insulating layer 150 in this embodiment covers a portion of the exposed portion 71 of the piezoelectric layer 70 in the X axis direction. In other words, the insulating layer 150 on the second electrode 80 continuously extends in the X axis direction to a halfway point of the exposed portion 71. In other words, the insulating layer 150 covers the end 80b of the second electrode 80, in addition to a portion of the exposed portion 71 of the piezoelectric layer 70. The insulating layer 150 does not cover the end 85a of the wiring layer 85.

The area located outwardly from the active area A0 in the X axis direction includes a sixth area A6, in addition to the first area A1, the second area A2, the fourth area A4, and the fifth area A5, and does not include the third area A3.

The sixth area A6 is adjacent to the second area A2 on the opposite side from the first area A1. In the sixth area A6, the vibration plate 50, the first electrode 60, and the piezoelectric layer 70 are stacked in this order from the pressure chamber plate 10 side, without the second electrode 80, the insulating layer 150, and the wiring layer 85.

In this configuration of the present embodiment, as in the above-described embodiment, damage to the piezoelectric layer 70 at the portion corresponding to the exposed portion 71 is reduced. The absence of the third area A3 can downsize the recording head 1.

Third Embodiment

Figure 8:
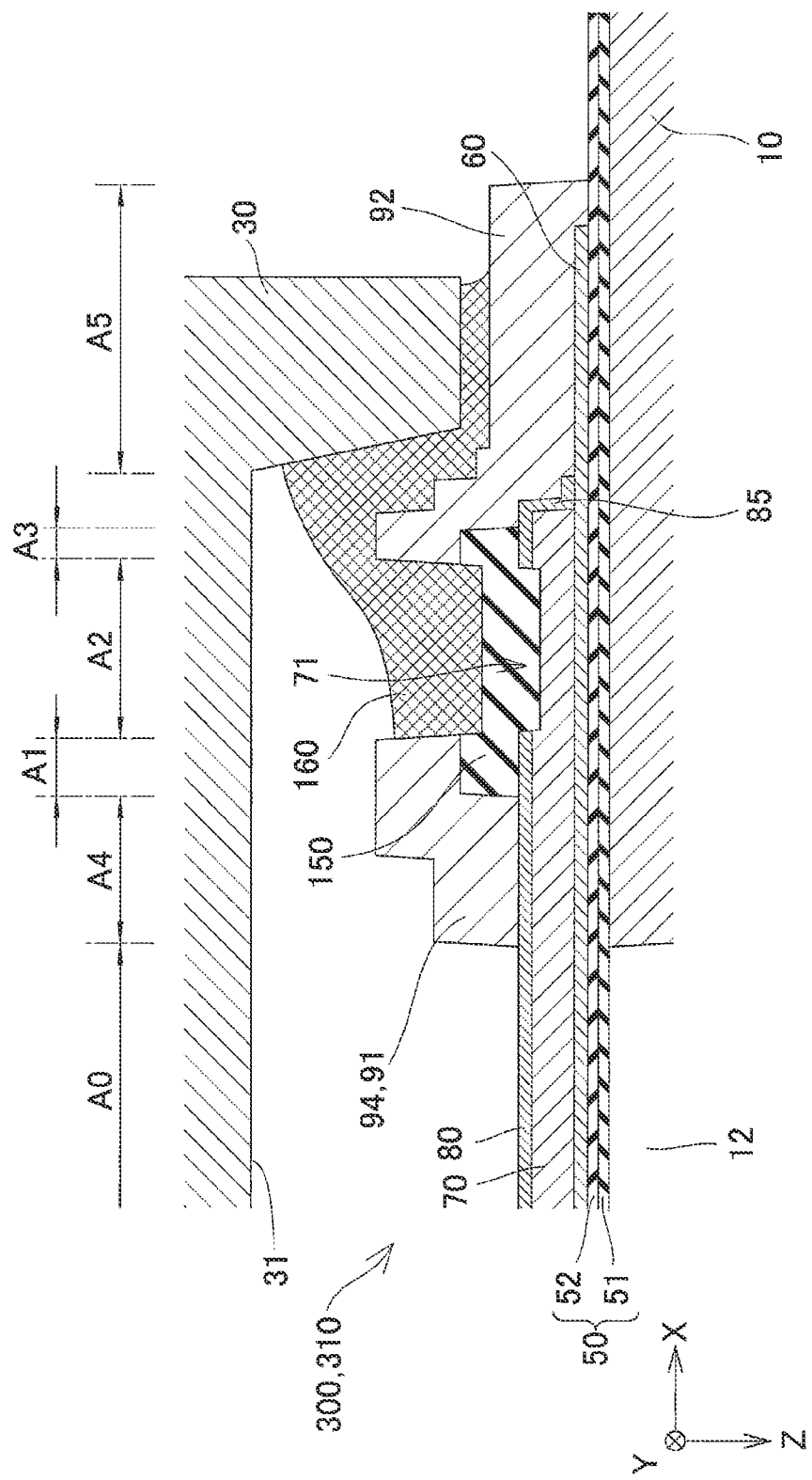
FIG. 8 is a cross-sectional view illustrating main components of a piezoelectric element according to Third Embodiment.

FIG. 8 is a magnified cross-sectional view illustrating main components of a recording head according to a third embodiment. This embodiment is a modification in which the attachment position of the protection plate 30 with an adhesive layer is changed, and the other configurations in this embodiment are the same as those in First Embodiment. The same reference numerals are assigned to the same components as First Embodiment without duplicated explanation.

As illustrated in FIG. 8, in the fifth area A5, the protection plate 30 of this embodiment is attached to the stack including the piezoelectric element 300, the vibration plate 50, and the pressure chamber plate 10 with the adhesive 160. In other words, in FIG. 8, the protection plate 30 is attached to the individual lead electrode 92 with the adhesive 160 in the fifth area A5.

The recording head 1 according to the present embodiment includes the protection plate 30 defining the holders 31 that are spaces housing the piezoelectric elements 300. The protection plate 30 is coupled to a stack including the piezoelectric element 300, the vibration plate 50, and the pressure chamber plate 10, with the adhesive 160 in the fifth area A5 on the opposite side of the second area A2 from the pressure chamber 12 in the X axis direction. During the attachment, the protection plate 30 is pressed in the Z axis direction. This may push out the adhesive from between the protection plate 30 and the individual lead electrode 92, and thus the protection plate 30 may be substantially in contact with the individual lead electrode 92 in the fifth area A5.

In the recording head 1 of this embodiment, as in the above-described embodiment, damage to the piezoelectric layer 70 at the portion corresponding to the exposed portion 71 is reduced.

In this configuration, the insulating layer 150 is not sandwiched between the pressure chamber plate 10 and the protection plate 30. Thus, during the attachment of the protection plate 30, the insulating layer 150 is not pressed and no residual stress remains between the insulating layer 150 and the protection plate 30, and thus the insulating layer 150 is less likely to be separated. Furthermore, during the attachment of the protection plate 30, an extra portion of the adhesive 160 accumulates in a space between the second auxiliary wiring portion 94 (91) and the individual lead electrode 92, or on the portion corresponding to the exposed portion 71, and thus the adhesive 160 is less likely to flow toward the operative portion 310.

This reduces the possibility that, for example, the adhesive 160 attached to the operative portion 310 will affect the deformation properties of the vibration plate 50 and the ejection properties of the recording head 1. Furthermore, the adhesive 160 accumulated in the space between the second auxiliary wiring portion 94 (91) and the individual lead electrode 92 covers the exposed portion 71 of the piezoelectric layer 70, and thus the insulating properties is improved.

OTHER EMBODIMENTS

The embodiments according to the present disclosure are described above. However, the present disclosure should not be limited to the above-described embodiments.

Figure 9:
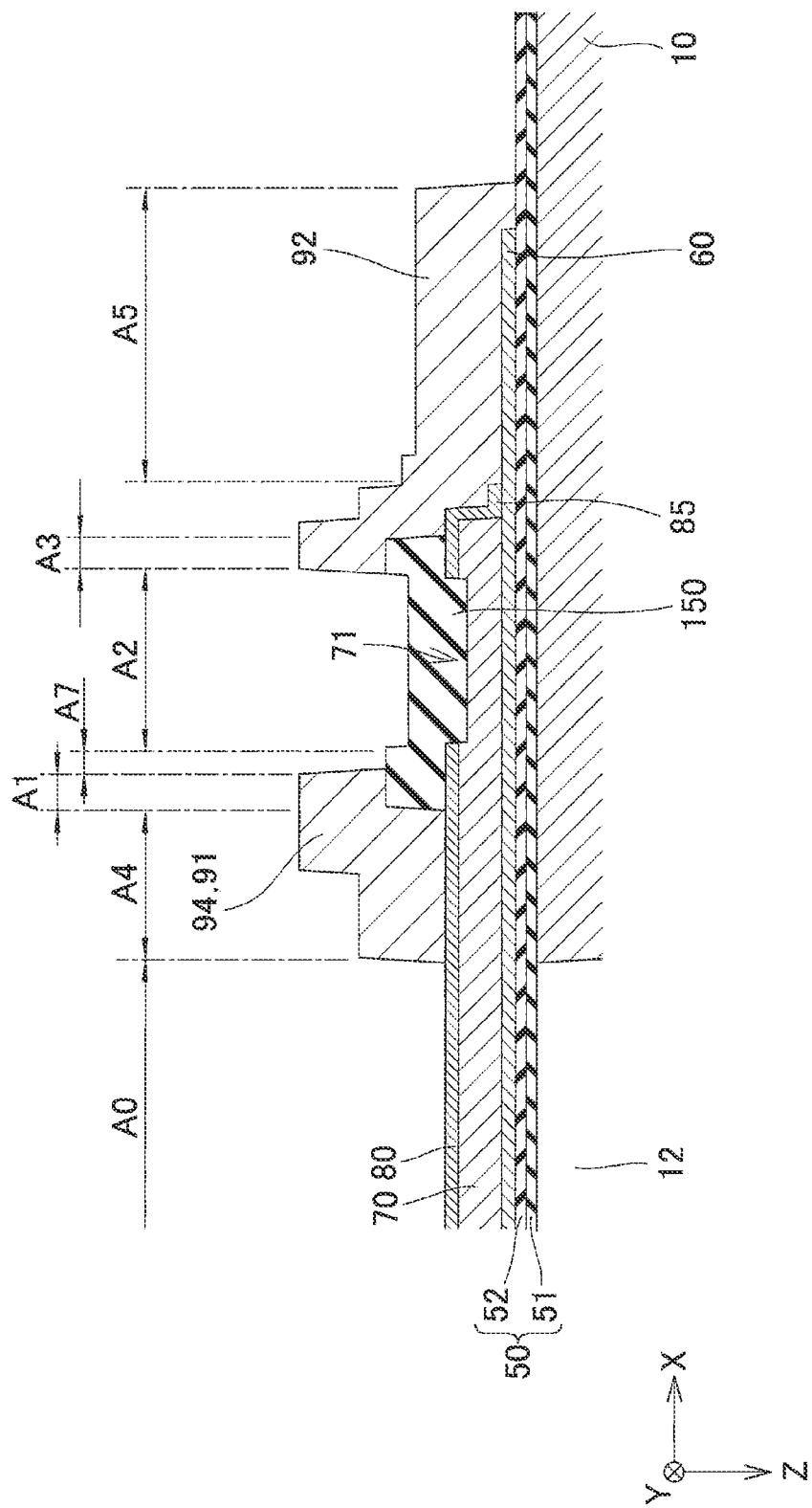
FIG. 9 is a cross-sectional view illustrating main components of a piezoelectric element according to another embodiment.

For example, in the above embodiments, the first area A1 and the second area A2 are adjacent to each other, but the first area A1 and the second area A2 do not necessarily have to be adjacent to each other. For example, as illustrated in FIG. 9, a seventh area A7 may be provided between the first area A1 and the second area A2. In the seventh area A7, the vibration plate 50, the first electrode the piezoelectric layer 70, the second electrode 80, and the insulating layer 150 are stacked in this order from the pressure chamber plate 10 side, without the second auxiliary wiring portion 94 (91).

Figure 10:
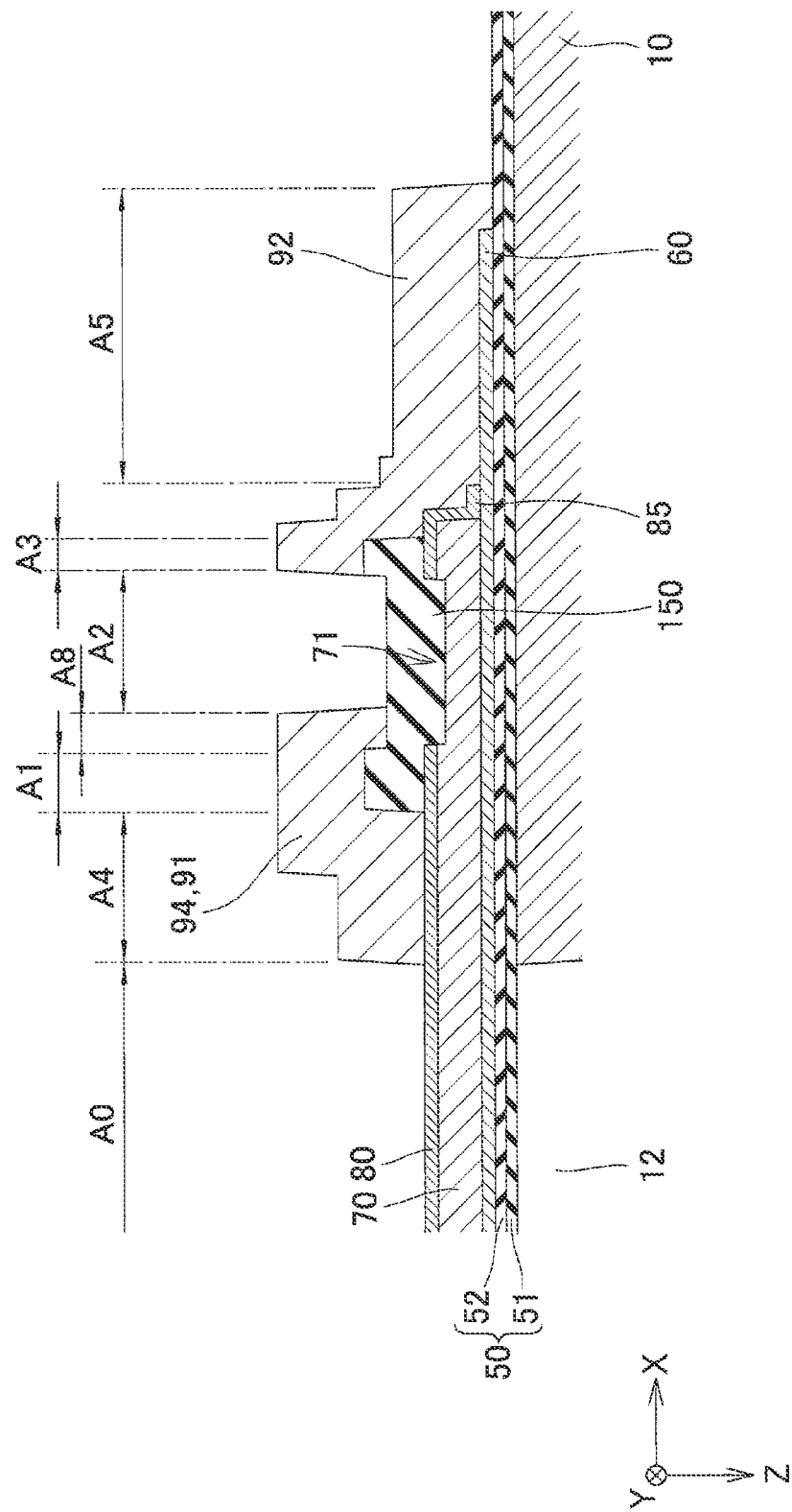
FIG. 10 is a cross-sectional view illustrating main components of a piezoelectric element according to another embodiment.

For example, as illustrated in FIG. 10, an eighth area A8 may be provided between the first area A1 and the second area A2. In the eighth area A8, the vibration plate the first electrode 60, the piezoelectric layer 70, the insulating layer 150, and the common lead electrode 91 are stacked in this order from the pressure chamber plate 10 side, without the second electrode 80.

In the configurations including the seventh area A7 or the eighth area A8, as in the above-described embodiments, damage to the piezoelectric layer 70 at the portion corresponding to the exposed portion 71 is reduced.

Figure 11:
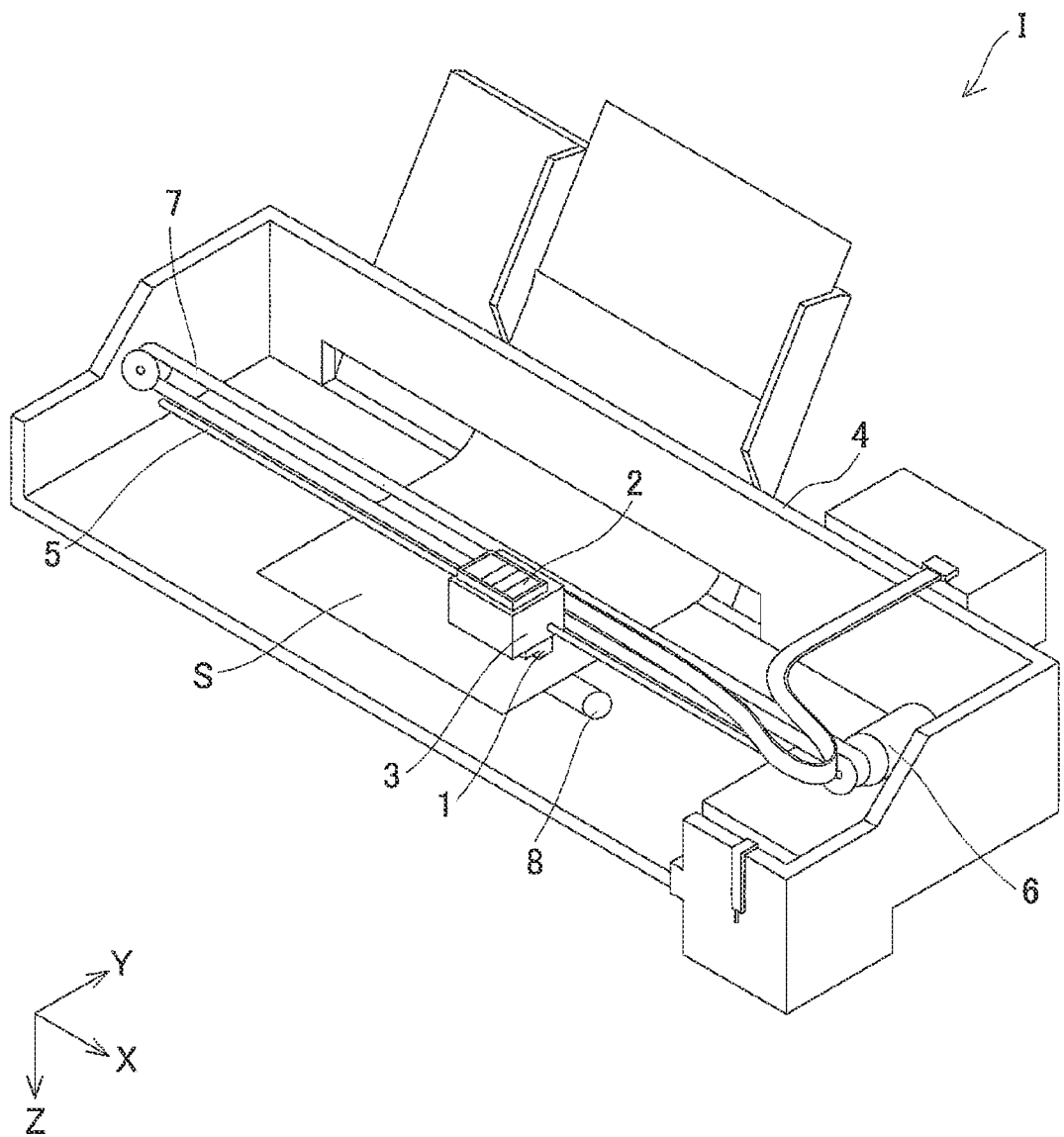
FIG. 11 illustrates a schematic configuration of a recording apparatus according to an embodiment.

The recording head 1 of each of these embodiments is mounted on an ink jet recording apparatus, which is an example of a liquid ejecting apparatus. FIG. 11 is a schematic view illustrating an example of an ink jet recording apparatus, which is an example of a liquid ejecting apparatus according to an embodiment.

In the ink jet recording apparatus I illustrated in FIG. 11, the recording head 1 includes a detachable cartridge 2 that constitutes an ink supplier, and the recording head 1 is mounted on a carriage 3. The carriage 3 having the recording head 1 is freely movable in the axial direction of a carriage shaft 5 attached to an apparatus body 4.

The driving force of a drive motor 6 is transmitted to the carriage 3 via gears (not illustrated) and a timing belt 7, moving the carriage 3 having the recording head 1 along the carriage shaft 5. The apparatus body 4 has a transportation roller 8 as a transportation unit, and a recording sheet S, which is a recording medium such as paper, is transported by the transportation roller 8. The transportation unit that transports the recording sheet S is not limited to the transportation roller and may be, for example, a belt or a drum.

In the ink jet recording apparatus I having such a configuration, when the recording sheet S is being transported in the −Y direction relative to the recording head 1 and the carriage 3 is being reciprocated in the X axis direction against the recording sheet S, the recording head 1 ejects ink droplets onto the entire surface of the recording sheet S, and thus printing is executed.

Furthermore, in the above-described example of the ink jet recording apparatus I, the recording head 1 mounted on the carriage 3 is reciprocated in the X axis direction, which is a main scanning direction. However, the present disclosure is not limited to this. For example, the present disclosure is applicable to a line recording apparatus in which a recording head 1 is fixed and printing is performed by only moving a recording sheet S such as paper in the Y axis direction, which is a sub scanning direction.

In the above-described embodiments, an ink jet recording head is described as an example of the liquid ejecting head, and an ink jet recording apparatus is described as an example of the liquid ejecting apparatus. However, the present disclosure is widely intended for various types of liquid ejecting heads and various types of liquid ejecting apparatuses. The present disclosure is applicable to a liquid ejecting head and liquid ejecting apparatus that eject liquid other than ink. Examples of the other liquid ejecting heads include various recording heads used in an image forming apparatus such as a printer, a color material ejecting head used to manufacture a color filter such as a liquid crystal display, an electrode material ejecting head used to form an electrode of a display such as an organic EL display and a field-emission display (FED), and a bio-organic material ejecting head used to manufacture biochips. The present disclosure is also applicable to a liquid ejecting apparatus including such a liquid ejecting head.

The present disclosure is not limited to a liquid ejecting head represented by the ink jet recording head and is applicable to a piezoelectric device such as an ultrasonic device, a motor, a pressure sensor, a pyroelectric element, and a ferroelectric element. The present disclosure is also applicable to a product including the piezoelectric device, such as a liquid ejecting apparatus including the liquid ejecting head, an ultrasonic sensor including the ultrasonic device, a robot including the motor as a driving source, an IR sensor including the pyroelectric element, and a ferroelectric memory including the ferroelectric element.

What is claimed is:

1. A liquid ejecting head comprising:
   a piezoelectric element including a first electrode, a piezoelectric layer, and a second electrode;
   a first conductive layer electrically coupled to the second electrode;
   an insulating layer formed of an insulating material;
   a vibration plate that is vibrated when the piezoelectric element is driven; and
   a pressure chamber plate defining a pressure chamber that applies pressure to a liquid when the vibration plate is driven, wherein
   the vibration plate, the first electrode, the piezoelectric layer, and the second electrode are stacked in this order from a side of the pressure chamber plate in an active area facing the pressure chamber, and
   an area located outwardly from the active area in a first direction includes: a first area in which the piezoelectric layer, the second electrode, the insulating layer, and the first conductive layer are stacked in this order in a second direction that intersects the first direction; and a second area in which the piezoelectric layer and the insulating layer are stacked in this order in the second direction without the second electrode and the first conductive layer.

2. The liquid ejecting head according to claim 1, wherein the first conductive layer has a larger thickness than the second electrode.

3. The liquid ejecting head according to claim 2, wherein a surface of the insulating layer away from the pressure chamber plate in the second area is closer to the pressure chamber plate than is a surface of the insulating layer away from the pressure chamber plate in the first area.

4. The liquid ejecting head according to claim 3, wherein the piezoelectric layer has a smaller thickness in the second area than in the first area.

5. The liquid ejecting head according to claim 3, wherein the area located outwardly from the active area in the first direction includes a third area in which the insulating layer and a second conductive layer electrically coupled to the first electrode are stacked in the second direction, and
   the second area is located between the first area and the third area in the first direction.

6. The liquid ejecting head according to claim 5, wherein the second conductive layer has a larger thickness than the first electrode.

7. The liquid ejecting head according to claim 5, wherein the area located outwardly from the active area in the first direction includes a fourth area in which the piezoelectric layer, the second electrode, and the first conductive layer are stacked in this order in the second direction, and
   the first area is located between the fourth area and the second area in the first direction.

8. The liquid ejecting head according to claim 7, wherein the first area is wider than the third area in the first direction.

9. The liquid ejecting head according to claim 7, wherein the fourth area is wider than the first area in the first direction.

10. The liquid ejecting head according to claim 1, further comprising a protection plate defining a space housing the piezoelectric element, wherein
    the protection plate is coupled to the insulating layer with an adhesive in the second area.

11. The liquid ejecting head according to claim 10, wherein the area located outwardly from the active area in the first direction includes a fourth area in which the piezoelectric layer, the second electrode, and the first conductive layer are stacked in this order in the second direction, the first area is located between the fourth area and the second area in the first direction,
the first conductive layer has a stepped portion in an area extending from the first area to the fourth area, and
the protection plate is coupled to the first conductive layer with an adhesive in the first area.

12. The liquid ejecting head according to claim 1, further comprising a protection plate defining a space housing the piezoelectric element, wherein the protection plate is coupled to a stack including the piezoelectric element, the vibration plate, and the pressure chamber plate with an adhesive in an area located outwardly from the second area in the first direction.

13. The liquid ejecting head according to claim 1, wherein the second area in which the vibration plate, the first electrode, the piezoelectric layer, and the insulating layer are stacked in this order from the side of the pressure chamber plate.

14. The liquid ejecting head according to claim 1, wherein the first direction is a longitudinal direction of the pressure chamber.

15. A liquid ejecting apparatus comprising the liquid ejecting head according to claim 1.

16. A piezoelectric device comprising:
a substrate having a recess;
a piezoelectric element including a first electrode, a piezoelectric layer, and a second electrode;
a vibration plate that is vibrated when the piezoelectric element is driven;
a first conductive layer electrically coupled to the second electrode; and
an insulating layer formed of an insulating material, wherein
the vibration plate, the first electrode, the piezoelectric layer, and the second electrode are stacked in this order from a side of the substrate in an active area having the recess, and
an area located outwardly from the active area in a first direction includes: a first area in which the piezoelectric layer, the second electrode, the insulating layer, and the first conductive layer are stacked in this order in a second direction that intersects the first direction; and a second area in which the piezoelectric layer and the insulating layer are stacked in this order in the second direction without the second electrode and the first conductive layer.

* * * * *